(12) United States Patent
Yoshihara

(10) Patent No.: US 7,964,426 B2
(45) Date of Patent: *Jun. 21, 2011

(54) SOLID-STATE IMAGE PICKUP DEVICE AND MANUFACTURING METHOD THEREOF

(75) Inventor: Ikuo Yoshihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/546,469

(22) Filed: Aug. 24, 2009

(65) Prior Publication Data

US 2009/0311823 A1    Dec. 17, 2009

Related U.S. Application Data

(60) Division of application No. 12/150,506, filed on Apr. 29, 2008, now Pat. No. 7,579,638, which is a continuation of application No. 11/168,952, filed on Jun. 28, 2005, now Pat. No. 7,378,695.

(30) Foreign Application Priority Data

Jul. 8, 2004  (JP) ................................. 2004-202226

(51) Int. Cl.
    *H01L 21/00* (2006.01)

(52) U.S. Cl. ............... 438/48; 438/42; 438/65; 257/292

(58) Field of Classification Search ............ 438/48, 438/65, 42; 257/292, 432, E21.211, E33.001, 257/E33.014, E33.017
See application file for complete search history.

(56) References Cited

U.S. PATENT DOCUMENTS

| 6,849,886 B1 * | 2/2005 | Han ................................ 257/292 |
| 7,187,023 B2 | 3/2007 | Yoshihara |
| 7,300,810 B2 * | 11/2007 | Yoshihara ....................... 438/24 |
| 7,365,380 B2 | 4/2008 | Yuzurihara et al. |
| 7,420,234 B2 | 9/2008 | Tatani et al. |
| 2005/0093088 A1 | 5/2005 | Lee |

FOREIGN PATENT DOCUMENTS

| JP | 11-284168 | 10/1999 |
| JP | 11-312731 | 11/1999 |
| JP | 2003-142674 | 5/2003 |
| JP | 2004-111488 | 4/2004 |
| JP | 2005-183920 | 7/2005 |

* cited by examiner

*Primary Examiner* — Theresa T Doan
(74) *Attorney, Agent, or Firm* — Robert J. Depke; Rockey, Depke & Lyons, LLC

(57) ABSTRACT

A solid-state image pickup device is provided in which a pixel forming region 4 and a peripheral circuit forming region 20 are formed on the same semiconductor substrate, a first element isolation portion is formed by an element isolation layer 21 in which an insulating layer is buried into a semiconductor substrate 10 in the peripheral circuit forming region 20, a second element isolation portion is composed of an element isolation region 11 formed within the semiconductor substrate 10 and an element isolation layer 12 projected in the upper direction from the semiconductor substrate 10 in the pixel forming region 4 and an element isolation layer 21 of the first element isolation portion and the element isolation layer 12 of the second element isolation portion contain the same insulating layers 17, 18 and 19. This solid-state image pickup device has a structure capable of suppressing a noise relative to a pixel signal and which can be microminiaturized in the peripheral circuit forming region.

1 Claim, 9 Drawing Sheets

SOLID-STATE IMAGE PICKUP DEVICE AND MANUFACTURING METHOD THEREOF

CROSS REFERENCES TO RELATED APPLICATIONS

The present invention contains subject matter related to U.S. application Ser. No. 12/150,506, which is incorporated herein by reference. The present application is a continuation of U.S. application Ser. No. 12/150,506 filed Apr. 29, 2008, which is a continuation of U.S. application Ser. No. 11/168,952, filed Jun. 28, 2005, now U.S. Pat. No. 7,378,695, issued May 27, 2008, which claims priority to Japanese Patent Application JP 2004-202226 filed in the Japanese Patent Office on Jul. 8, 2004, the entire contents of which being incorporated hereby by reference.

BACKGROUND OF THE INVENTION

1. Field of the Invention

The present invention relates to a solid-state image pickup device (image sensor) for use with electronic equipment such as a video camera and a digital still camera and a manufacturing method thereof.

2. Description of the Related Art

A solid-state image pickup device (image sensor) is a semiconductor device having a structure to read out a pixel signal by using a plurality of pixels serving as photoelectric-converting means and a MOS (metal-oxide semiconductor) transistor for selectively reading out signals from the pixels. The solid-state image pickup device is suitable for use with electronic equipment such as a video camera and a digital still camera.

Of the above-mentioned solid-state image pickup device, in particular, a so-called CMOS (complementary MOS) type solid-state image pickup device (CMOS image sensor) manufactured by a CMOS process has merits in which it can be operated at a low voltage, it consumes less electric power, it is multifunction and in which it can be formed as one-chip with peripheral circuits (that is, it can be formed as a SOC (system on-chip)).

Accordingly, the CMOS type solid-state image pickup device receives a remarkable attention as image pickup devices for use as the application to a camera for a mobile phone, a digital still camera and a digital video camera and it is now commercially available on the market.

FIG. 1 of the accompanying drawings is a schematic diagram (diagram showing an arrangement of a circuit) showing an example of an arrangement of a CMOS type solid-state image pickup device (CMOS image sensor) according to the related art.

As shown in FIG. 1, this CMOS image sensor includes a pixel forming region 4 in which a plurality of pixels 1, each of which composed of a photodiode 2 serving as a photoelectric-converting element and a MOS transistor 3 for selectively reading signal electrical charges from the photodiode 2, is arrayed on the same semiconductor substrate in a two-dimensional fashion (that is, an XY matrix fashion) and pixel selection and signal output peripheral circuits 5 and 6 for selecting a pixel and for outputting a signal.

Other regions than the pixel forming region 4, that is, the region containing the pixel selection circuit 5 and the signal output circuit 6 will hereinafter be referred to as a "peripheral circuit forming region".

In the pixel forming region 4, each pixel 1 consists of the photodiode 2 and three MOS transistors of a transfer transistor 3, a reset transistor 7 and an amplifying transistor 8. Also, in the peripheral circuit forming region, the pixel selection circuit 5 and the signal output circuit 6 are composed of CMOS transistors.

In the CMOS image sensor according to the related art, respective circuits in the peripheral circuit forming region are formed of CMOS transistors.

On the other hand, in the pixel forming region, the MOS transistors constructing the respective pixels are all NMOS (N type MOS) transistors.

It is customary that the NMOS transistor constructing this pixel has the same element isolation structure as that of the NMOS transistor used in the peripheral circuit forming region (see Cited Patent Reference 1, for example).

FIG. 2 is a cross-sectional view showing an element isolation structure for use with the peripheral circuit forming region.

As shown in FIG. 2, an N type semiconductor well region 52 and a P type semiconductor well region 53 are formed within a semiconductor substrate 51. A PMOS (P type MOS) transistor 54 is formed within the N type semiconductor well region 52 and an NMOS transistor 55 is formed within the P type semiconductor well region 53, respectively.

Then, the PMOS transistor 54 and the NMOS transistor 55 are electrically isolated from each other by an element isolation portion 56 formed of a so-called STI (shallow trench isolation) in which an element isolation layer is buried into a groove (trench) formed within the semiconductor substrate 51. This element isolation portion 56 has an oxide film, for example, buried therein as the element isolation layer.

Further, in the CMOS image sensor according to the related art, since the NMOS transistor constructing the pixel is isolated by the element isolation portion having the same structure as that of the NMOS transistor used in the peripheral circuit forming region, the element isolation portion 56 formed of the shallow trench isolation in which the element isolation layer is formed within the semiconductor substrate 51 as shown in FIG. 2 is formed similarly in the pixel forming region 4 shown in FIG. 1 and thereby the pixel forming region 4 is isolated from the adjacent pixel cell 1.

Also, source/drain diffusion layers of transistors such as the transfer transistor 3, the amplifying transistor 8 and the reset transistor 7 formed on each pixel cell 1 of the pixel forming region 4 also are respectively isolated by the element isolation portions 56 having similar arrangements.

[Cited Patent Reference 1]: Official Gazette of Japanese laid-open patent application No. 2003-142674 (FIG. 10)

However, in the related-art CMOS image sensor, as described above, since the element isolation portion 56 is formed by burying the element isolation layer into the trench formed within the semiconductor substrate 51, it is frequently observed that strain and crystal defect occur in the semiconductor substrate 51 due to damages produced when the trench is formed on the semiconductor substrate 51 or stress generated from a difference between coefficients of thermal expansion of the semiconductor substrate 51 and the buried insulating layer (element isolation layer) 56 in the heat treatment process during manufacturing.

Due to the above-mentioned strain and crystal defect, unnecessary electrical charges (leakage electric current and dark electric current) are generated and entered the photodiode 2.

Electrical charges accumulated in the photodiode 2 are transferred through the transfer transistor 3 so that the electrical charge generated due to the strain and the crystal defect becomes noise signals relative to the pixel signal as they are.

Further, since a trench is formed on a single crystal substrate like a silicon substrate, an ending end portion of single crystal is formed not only on the surface of the substrate but also on the side wall of the trench, an interface state density formed at this ending end portion also becomes a factor of the noise signal relative to the image signal.

Also, although the NMOS transistor constructing the pixel is isolated by the element isolation portion 56 having the same structure as that of the NMOS transistor used in the peripheral circuit forming region, there are many examples in which the CMOS transistor for use in the peripheral circuit forming region is manufactured by a forefront process of a microminiaturization technology. Further, since the CMOS transistor is mainly designed for the purpose of increasing an operation speed, decreasing power consumption and saving a space, there are many examples in which a power source voltage also is decreased.

For this reason, if the element isolation portion 56 is optimized in accordance with a design of the CMOS transistor of the peripheral circuit forming region, then it is unavoidable that a solid-state image pickup device will have an arrangement which tends to easily generate the above-mentioned unnecessary electrical charges.

SUMMARY OF THE INVENTION

In view of the aforesaid aspects, the present invention intends to provide a solid-state image pickup device having a structure in which a noise relative to an image signal can be suppressed and in which a peripheral circuit forming region can be microminiaturized in size and a manufacturing method thereof.

According to an aspect of the present invention, there is provided a solid-state image pickup device which is composed of a semiconductor substrate, a pixel formed of a photoelectric-converting element, a selection transistor for reading signal electrical charges from the photoelectric-converting element, a pixel forming region composed of the pixel and the selection transistor and a peripheral circuit forming region, the pixel forming region and the peripheral circuit forming region being formed on the same semiconductor substrate, wherein a first element isolation portion is formed by an element isolation layer containing insulating layers buried into the semiconductor substrate in the peripheral circuit forming region, a second element isolation portion is composed of an element isolation region formed within the semiconductor substrate and an element isolation layer projected in the upper direction from the semiconductor substrate in the pixel forming region and the element isolation layer of the first element isolation portion and the element isolation layer of the second element isolation portion are formed so as to contain the same insulating layers.

According to another aspect of the present invention, there is provided a method of manufacturing a solid-state image pickup device in which a pixel forming region composed of a pixel formed of a photoelectric-converting element and a selection transistor for reading signal electrical charges from the photoelectric-converting element and a peripheral circuit forming region are formed on the same semiconductor substrate. This method is composed of the steps of a process for forming a stopper layer on the semiconductor substrate, a process for forming an opening portion by selectively removing the stopper layer of the portion corresponding to an element isolation portion in the portion serving as the pixel forming region and the portion serving as the peripheral circuit forming region, a process for forming a trench ranging from the stopper layer to the inside of the semiconductor substrate in the portion serving as the peripheral circuit forming region and a process for planarizing the trench and the opening portion by burying insulating layers into the inside of the trench and into the inside of the opening portion of the pixel forming region.

DESCRIPTION OF THE PREFERRED EMBODIMENTS

The present invention will now be described with reference to the drawings.

Figure 3:
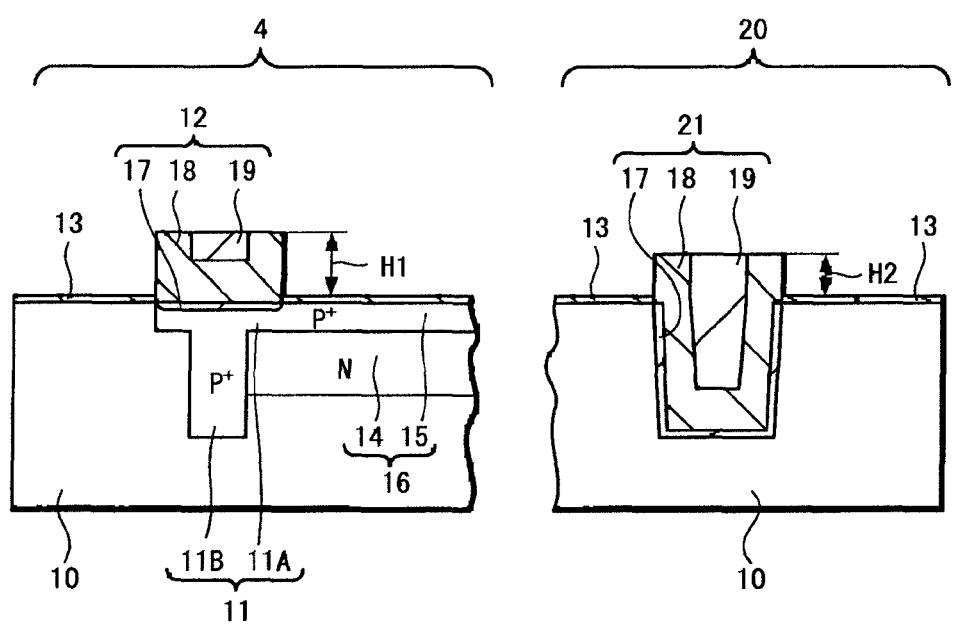
FIG. 3 is a schematic cross-sectional view showing an arrangement of a solid-state image pickup device according to an embodiment of the present invention.

FIG. 3 is a schematic diagram (cross-sectional view) showing an arrangement of a solid-state image pickup device according to an embodiment of the present invention.

Figure 1:
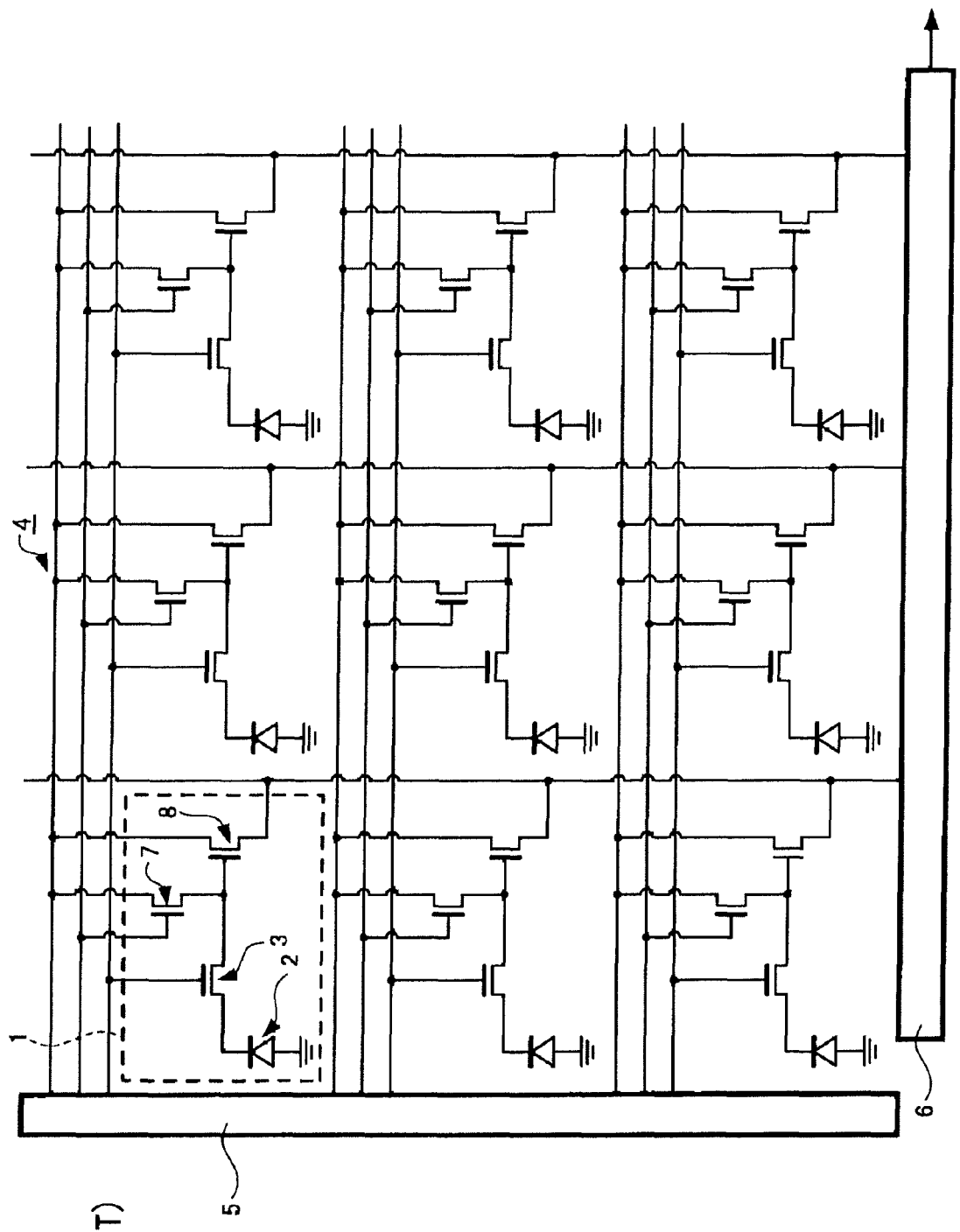
FIG. 1 is a schematic diagram showing a circuit arrangement of a solid-state image pickup device according to the related art.
Figure 4:
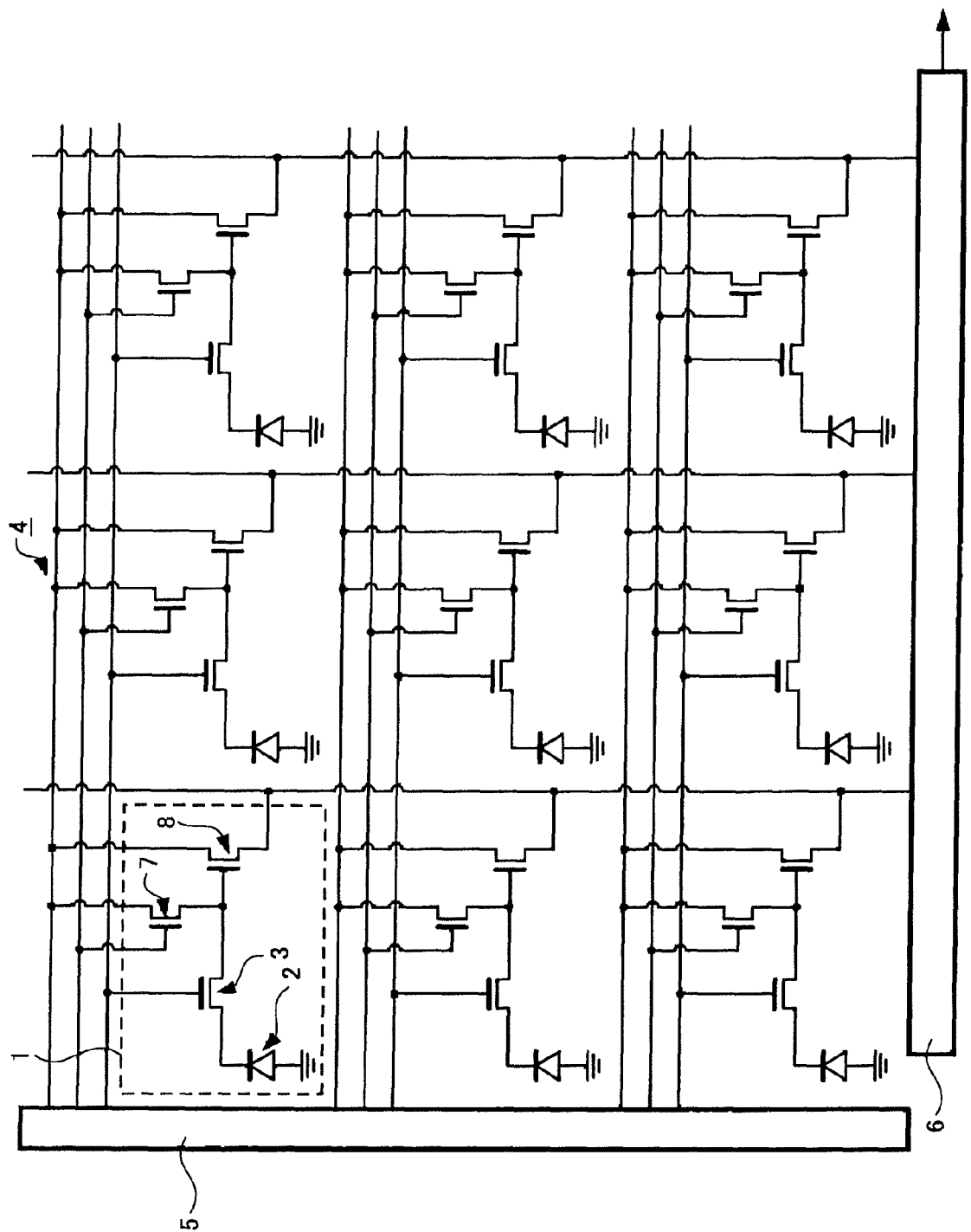
FIG. 4 is a diagram showing a circuit arrangement of the solid-state image pickup device shown in FIG. 3.

Further, FIG. 4 is a schematic diagram showing a circuit arrangement of the solid-state image pickup device according to the embodiment of the present invention. The solid-state image pickup device according to this embodiment has a circuit arrangement similar to the related-art circuit arrangement which was already described with reference to FIG. 1.

As shown in FIG. 3, this solid-state image pickup device includes the same semiconductor substrate 10 made of an N type silicon substrate, for example, on which there are formed a pixel forming region 4 consisting of a large number of pixel cells 1 including photodiodes 2 and a peripheral circuit forming region 20.

Figure 2:
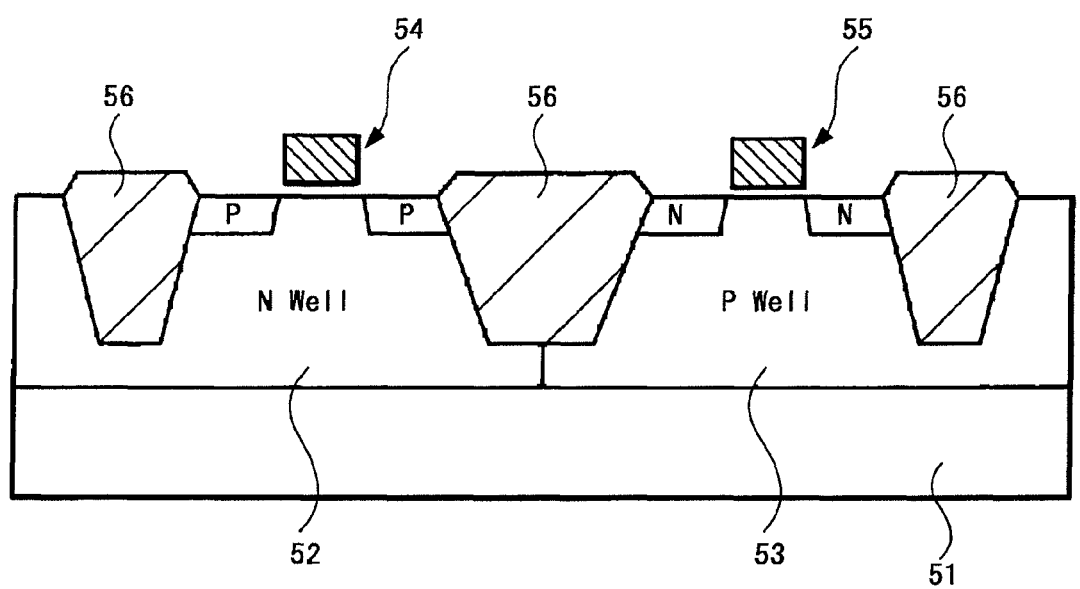
FIG. 2 is a cross-sectional view showing a peripheral circuit forming region of a CMOS sensor according to the related art.

As shown in FIG. 3, the element isolation portion in which an element isolation layer 21 such as a silicon oxide film is buried into the semiconductor substrate 10 is formed in the peripheral circuit forming region 20 similarly to the arrangement of the related-art element isolation portion 56 shown in FIG. 2. That is, this element isolation portion has a so-called trench element isolation (STI (shallow trench isolation)) structure. As shown in FIG. 3, a thin insulating film (for example, silicon oxide film) 13 is deposited on the surface of the semiconductor substrate 10.

As shown in FIG. 3, in the pixel forming region 4, an N type electrical charge accumulation region 14 formed within the semiconductor substrate 10 and a P type ($P^+$) positive electrical charge accumulation region 15 constitute a sensor portion 16.

Although not shown, in the pixel forming region 4 and the peripheral circuit forming region 20, the source/drain regions of transistors are respectively formed within the semiconductor substrate 10 and the gate electrodes of transistors and the like are formed on the semiconductor substrate 10 through the insulting film 13. Also, in the pixel forming region 4, a color filter and an on-chip micro lens are further formed on the upper portion thereof when necessary, although not shown.

FIG. 4 is a schematic diagram showing a circuit arrangement of this CMOS image sensor. As shown in FIG. 4, the pixel forming region 4 in which a plurality of pixels 1, each consisting of a photodiode 2 for carrying out photoelectric conversion and a MOS transistor 3 for selectively reading the photodiode 2, are arrayed in a two-dimensional fashion (that is, in an XY matrix fashion) and the pixel selection and signal output peripheral circuits 5 and 6 are formed on the same semiconductor substrate 10.

In the pixel forming region 4, each pixel 1 is composed of the photodiode 2 and three MOS transistors of a transfer transistor 3, a reset transistor 7 and an amplifying transistor 8. Also, in the peripheral circuit forming region 20, the pixel selection circuit 5 and the output circuit 6 are composed of CMOS transistors.

In the solid-state image pickup device according to this embodiment, in particular, in the pixel forming region 4, the arrangement of the element isolation portion (second element isolation portion) to isolate the transistors 3, 7 and 8 (see circuit arrangement diagram of FIG. 4) between the respective cells 1 and within the respective cells 1 is different from that of the element isolation portion (first element isolation portion) of the peripheral circuit forming region 20.

More specifically, as shown in the cross-sectional view of FIG. 3, in the pixel forming region 4, an element isolation region 11 formed of a P type (P$^+$) impurity diffusion layer is formed within the semiconductor substrate 10, a convex-like element isolation layer (cover layer) 12 protruded from the semiconductor substrate 10 is formed above this P type element isolation region 11 and these element isolation region 11 and element isolation layer (cover layer) 12 constitute the element isolation portion (second element isolation portion).

As shown in FIG. 3, the P type element isolation region 11 includes an upper wide portion 11A and a lower narrow portion 11B and it is formed so as to have a substantially T-like cross section.

Since the P type element isolation region 11 is formed within the semiconductor substrate 10 in the pixel forming region 4 as described above, it becomes possible to carry out element isolation by junction and isolation.

Also, since the element isolation layer (cover layer) 12 is formed above the P type element isolation region 11, it is possible to suppress a leakage electric current generated by a parasitic MOS.

Further, in the solid-state image pickup device according to this embodiment, in particular, the element isolation layer (cover layer) 12 constructing the element isolation portion of the pixel forming region 4 and the element isolation layer 21 constructing the element isolation portion of the peripheral circuit forming region 20 are formed of the same insulating layers (for example, silicon oxide films) 17, 18 and 19.

More specifically, the element isolation layer (cover layer) 12 constructing the element isolation portion of the pixel forming region 4 is composed of the thin silicon oxide film 17 formed near the interface between it and the silicon substrate 10, the silicon oxide film 18 and the silicon oxide film 19 formed near upper central portion. Also, since the element isolation layer 21 constructing the element isolation portion of the peripheral circuit forming region 20 is composed of the thin silicon oxide film 17 formed near the interface between it and the silicon substrate 10, the silicon oxide film 19 and the silicon oxide film 19 formed at the central portion, the insulating layers (for example, SiO$_2$ layers) 17, 18 and 19 are made common to the element isolation layer (cover layer) 12 and the element isolation layer 21.

Since the element isolation layer (cover layer) 12 and the element isolation layer 21 are formed of the same insulating layers 17, 18 and 19 as described above, the process for forming the element isolation layer (cover layer) 12 constructing the element isolation portion of the pixel forming region 4 and the process for forming the element isolation layer 21 constructing the element isolation portion of the peripheral circuit forming region 20 can be made common.

Consequently, it is possible to decrease the number of the manufacturing processes.

Then, according to this embodiment, as shown in FIG. 3, a height of the element isolation layer 21 of the peripheral circuit forming region 20 (that is, height on the silicon oxide film 13 formed on the surface of the silicon substrate 10) is higher than the element isolation layer formed of the ordinary STI.

As a consequence, a height H1 of the element isolation layer (cover layer) 12 of the pixel forming region 4 and the height H2 of the element isolation layer 21 of the peripheral circuit forming region 20 has a relatively small difference therebetween.

Also, in the solid-state image pickup device according to this embodiment, the P type positive electrical charge accumulation region 15 on the surface of the sensor portion 16 is connected to the upper portion 11A of the element isolation region 11, and the N type electrical charge accumulation region 14 of the sensor portion 16 is extended under the element isolation layer (cover layer) 12, which is further formed up to the portion in contact with the lower portion 11B of the element isolation region 11.

In the arrangement in which the element isolation portion of the pixel forming region has the STI structure according to the related art, as is described in the above-described Cited Patent Reference 1, for example, the P type region was formed around the insulating layer having the STI structure. As a result, due to the existence of the P type region, the N type electrical charge accumulation region of the sensor portion might not be increased in area.

On the other hand, according to this embodiment, since element isolation is carried out by the element isolation region 11 instead of element isolation done by the STI structure in the pixel forming region 14, it becomes possible to make the width of the element isolation portion within the semiconductor substrate 10 become narrower than that of the STI structure. Thus, the N type electrical charge accumulation region 14 of the sensor portion 16 can be increased in width so that it can be extended under the element isolation layer (cover layer) 12.

As described above, the N type electrical charge accumulation region 14 can be extended under the element isolation layer (cover layer) 12, thereby making it possible to increase a saturation electrical charge amount Q$_s$.

It is desirable that the element isolation layer (cover layer) 12 of the pixel forming region 4 should have a depth less than 50 nm within the semiconductor substrate 10 and that it should have a thickness which falls within a range of from 50 nm to 150 nm.

Also, while the element isolation layer (cover layer) 12 is formed so as to enter a part of the semiconductor substrate 10 in FIG. 3, the present invention is not limited thereto and the element isolation layer (cover layer) 12 may be formed only on the semiconductor substrate 10.

It is desirable that the element isolation layer 21 of the peripheral circuit forming region 20 should have a depth ranging of from 150 nm to 450 nm within the semiconductor substrate 10.

Figure 5A:
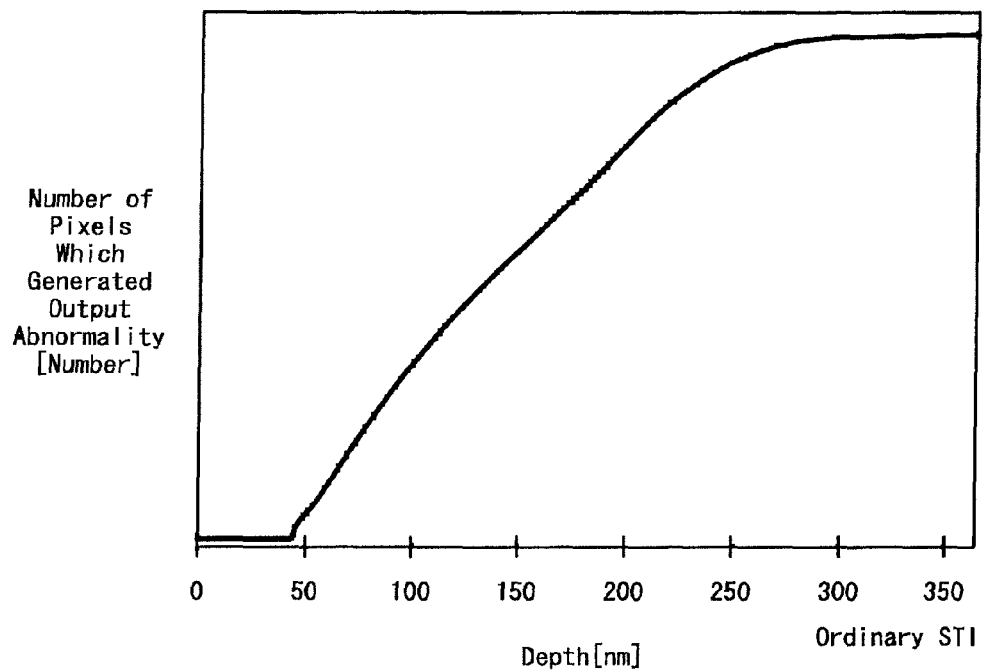
FIG. 5A is a diagram showing a relationship between a depth of an element isolation layer of the solid-state image pickup device shown in FIG. 3 within the substrate and the number of pixels which generated output abnormality.

FIG. 5A shows a relationship between the depth (amount in which the silicon substrate 10 is trenched) of the element isolation layer (cover layer) 12 formed of the silicon oxide film within the silicon substrate 10 and the number of pixels from which output abnormalities (noises) were generated.

As shown in FIG. 5A, when the depth of the element isolation layer 12 exceeds 50 nm, the number of the pixels which generated the output abnormalities is increased. The reason for this is that stress caused by a difference between coefficients of thermal expansion generated between the buried element isolation layer (silicon oxide film) 12 and the silicon substrate 10 reaches the level which may not be neglected. Then, when the depth of the element isolation layer 12 is increased more, this means that interface state density of the silicon substrate 10 is increased, thereby resulting in uncontrollable trap electrical charges being increased.

"ORDINART STI" in FIG. 5A denotes a thickness of 350 nm of the element isolation layer having an ordinary STI structure. From FIG. 5A, it is to be understood that the arrangement of this embodiment can considerably decrease the number of pixels which generated the output abnormalities as compared with the element isolation layer having the ordinary STI structure.

Figure 5B:
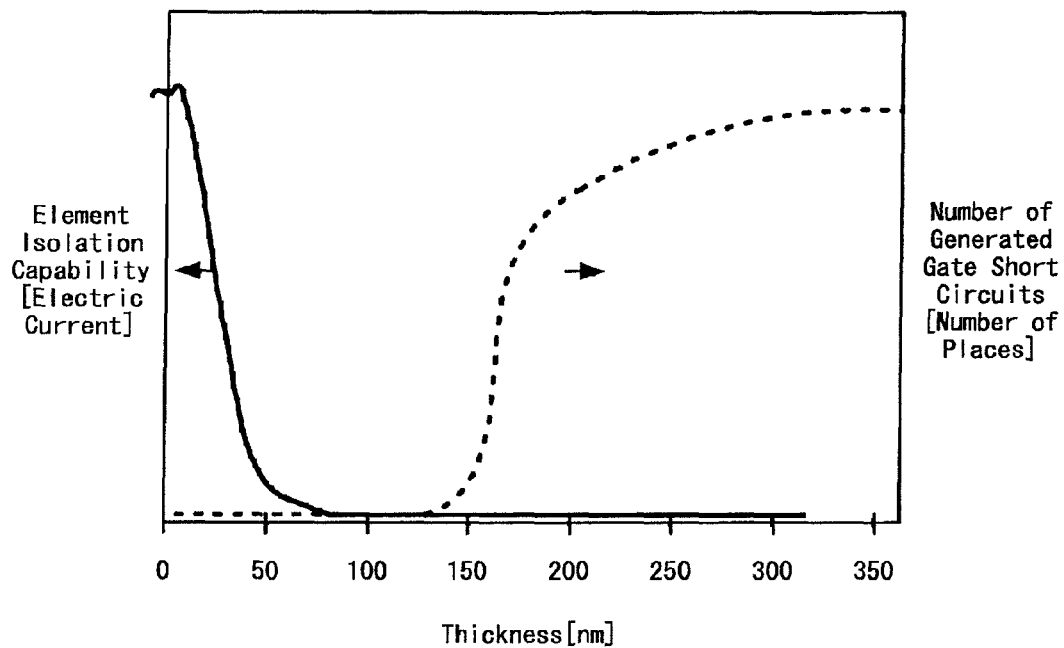
FIG. 5B is a diagram showing a relationship between a thickness of the element isolation layer of the solid-state image pickup device shown in FIG. 3 and the number in which gate short circuits occurred.

FIG. 5B shows a relationship between a thickness of the element isolation layer (silicon oxide film) 12 of the pixel forming region 4, element isolation capability (limit value of leakage electric current) and the number in which gate short-circuit occurred. In FIG. 5B, a solid line represents the element isolation capability and a broken line represents the number in which gate short-circuit occurred.

As shown in FIG. 5B, when the thickness of the element isolation layer 12 becomes less than 50 nm, a leakage electric current of a parasitic MOS transistor which indicates the element isolation capability is increased. On the other hand, when the thickness of the element isolation layer 12 exceeds 150 nm, the gate electrode tends to considerably easily short-circuit so that a yield is lowered remarkably. The reason for this is that, when the thickness of the element isolation layer 12 is increased, processing of the gate electrode formed on the element isolation layer 12 becomes difficult and hence the number in which short-circuit occurred is increased.

Accordingly, it is desirable that the element isolation layer (cover layer) 12 formed on the pixel forming region 4 should have a depth less than 50 nm within the semiconductor substrate 10 and that it should have a thickness ranging of from 50 nm to 150 nm.

Further, it is preferable that the minimum isolation width of the element isolation portion in the peripheral circuit forming region 20 should be smaller than that of the element isolation portion of the pixel forming region 4.

According to the above-mentioned arrangement, since the minimum isolation width of the element isolation portion is small in the peripheral circuit forming region 20, the solid-state image pickup device can be microminiaturized more, its operation speed can be increased, its power consumption can be decreased and its space can be saved. Also, since the minimum isolation width of the element isolation portion is large in the pixel forming region 4, the occurrence of noise and a leakage current can be suppressed sufficiently.

A solid-state image pickup device according to this embodiment can be manufactured as follows:

First, a silicon oxide film 31 is formed by oxidizing the surface of the semiconductor substrate, for example, silicon substrate. A thickness of this silicon oxide film 31 is selected in a range of from 5 nm to 20 nm, for example.

Figure 6A:
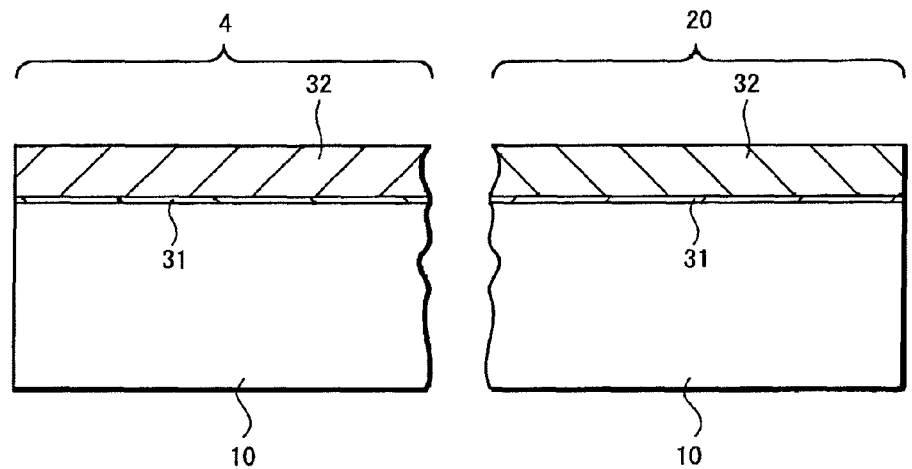
FIGS. 6A to 6L are respectively process diagrams showing a manufacturing method of the solid-state image pickup device shown in FIG. 3.

Next, a silicon nitride film 32 having a film thickness of 100 nm to 200 nm, for example, is deposited on the silicon oxide film 31 by a CVD (chemical vapor deposition) method (see FIG. 6A). This silicon nitride film 32 serves as a polish stopper in the process in which a silicon oxide film, which will be formed later on, is polished by a CMP (chemical mechanical polish) method.

Figure 6B:
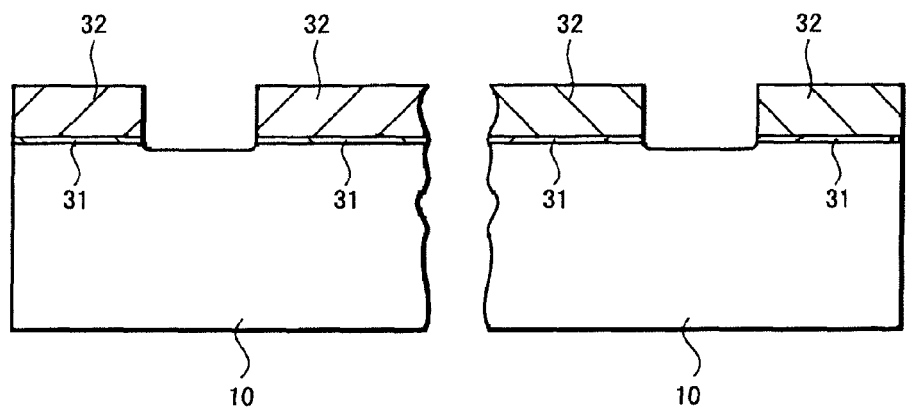

Next, as shown in FIG. 6B, the silicon nitride films 32 are selectively removed from the places to form the element isolation layers 12 and 21 in the pixel forming region 4 and the peripheral circuit forming region 20. It is desirable that the amount in which the silicon substrate 10 is trenched in the pixel forming region 4 when the silicon nitride films 32 are selectively removed should be decreased as much as possible. The depth in which the silicon substrate 10 was trenched should be selected to be less than 50 nm.

Next, after a resist was formed over the whole surface, a resist pattern 33 which covers the pixel forming region 4 is formed by exposure and development.

Figure 6C:
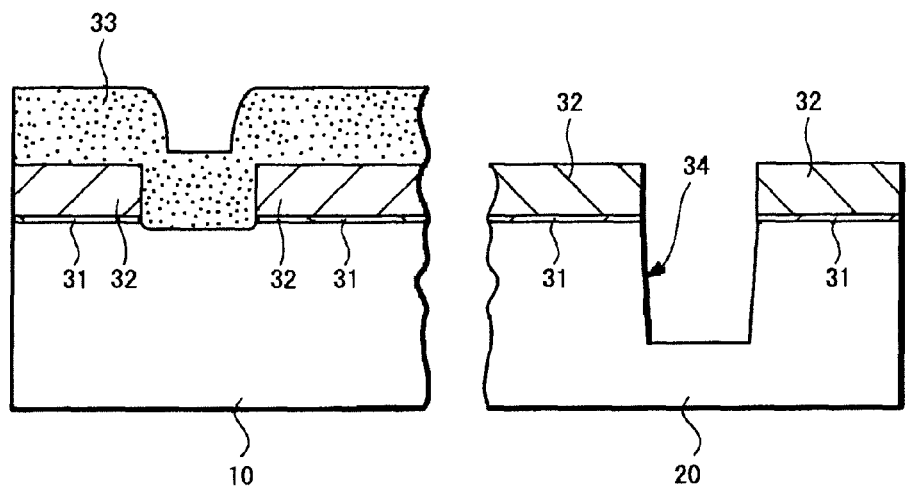

Then, in the peripheral circuit forming region 20, the silicon nitride film 32 is used as the hard mask and a groove (trench) 34 is formed on the silicon substrate 10 by an ordinary method (see FIG. 6C). At that time, the silicon nitride film 32 is etched away by an etching process to produce the trench 34 and hence the silicon nitride film 32 in the peripheral circuit forming region 20 is made a little thinner than the silicon nitride film 32 in the pixel forming region 4.

Figure 6D:
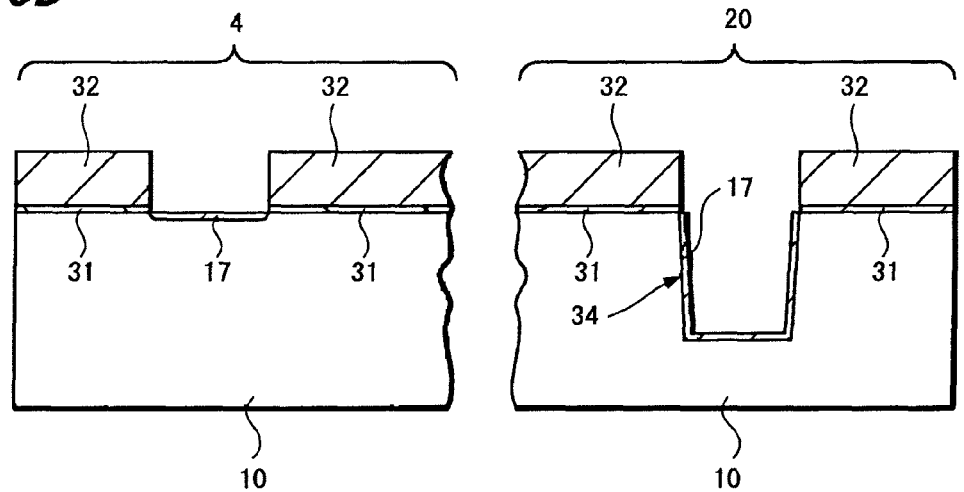

Subsequently, the resist pattern 33 is removed and then silicon oxide films 17 having a film thickness ranging of from 5 nm to 20 nm are respectively formed on the pixel forming region 4 and the peripheral circuit forming region 20 by oxidizing the surface of the silicon substrate 10 exposed by the opening as shown in FIG. 6D.

Next, after the resist was formed over the whole surface, a resist pattern 35 which covers the peripheral circuit forming region 20 is formed by exposure and development.

Figure 6E:
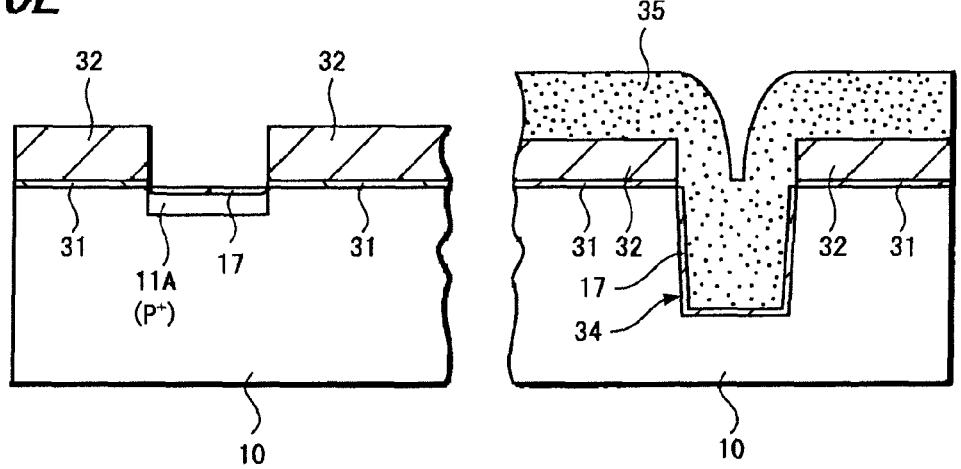

Further, by implanting ions of P type impurities, for example, boron (B) at the concentration of $1 \times 10^{12}$ to $5 \times 10^{13}$ borons/cm$^2$, an upper portion 11A of the element isolation region (channel stopper layer) 11 is formed in the pixel forming region 4 (see FIG. 6E).

Subsequently, after the resist pattern 35 was removed, a silicon oxide film 18 is formed over the whole surface by a CVD method. This silicon oxide film 18 is formed to be thinner than the silicon nitride film 32, whereby the silicon oxide film 18 is formed along the inner wall of the opening of the silicon nitride film 32 in the pixel forming region 4, resulting in a space being left in the central portion of the opening. Also, a space is left at the central portion of the inside of the trench 34 of the peripheral circuit forming region 20.

Figure 6F:
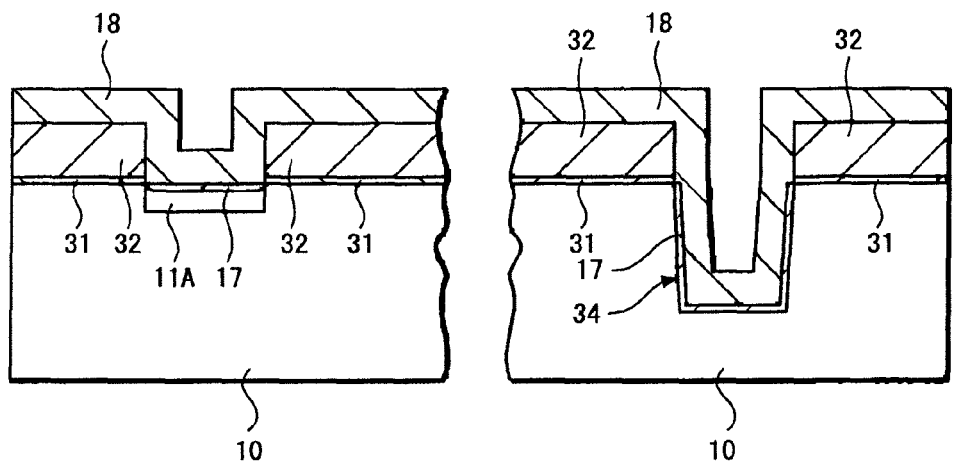

It is desirable that this silicon oxide film 18 should be a HTO (High Temperature Oxide) (see FIG. 6F).

Next, after a resist was formed over the whole surface, a resist pattern 36 which covers the peripheral circuit forming region 20 is formed by exposure and development.

Figure 6G:
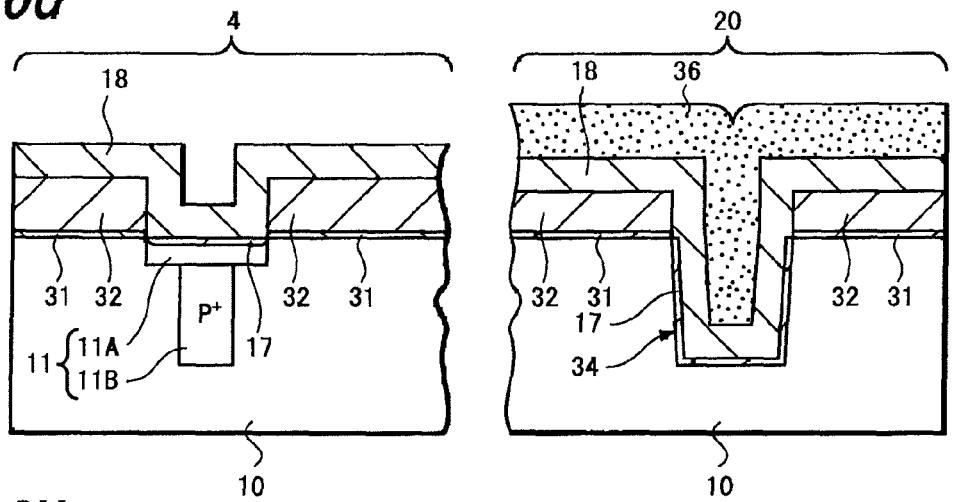

Further, by implanting ions of P type impurities, for example, boron (B) at a concentration of $5 \times 10^{12}$ to $1 \times 10^{14}$ borons/cm$^2$, a lower portion 11B of the element isolation region 11 is formed in the pixel forming region 4. Herein, the silicon oxide film 18 formed within the opening of the silicon nitride film 32 acts as a mask for ion implantation so that the width of the lower portion 11B of the element isolation region 11 becomes a narrow width corresponding to the space at the central portion of the opening. As a consequence, the lower portion 11B of the element isolation region 11 is formed as a width narrower than that of the upper portion 11A. Thus, there is formed the element isolation region 11 having a T-like cross section (see FIG. 6G).

Figure 6H:
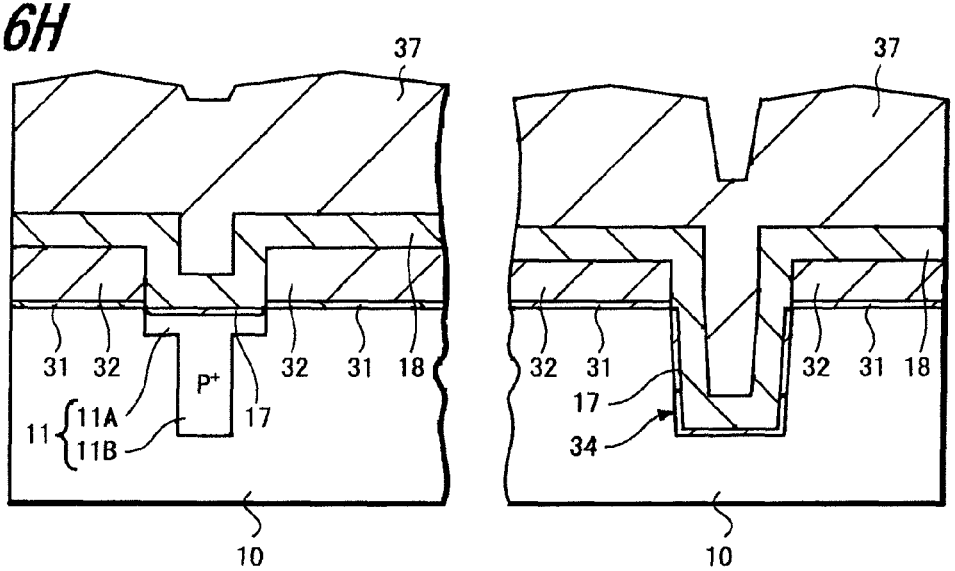

Next, after the resist pattern 36 was removed, as shown in FIG. 6H, a silicon oxide film 37 is formed so as to have a film thickness ranging of from 100 nm to 200 nm by an HDP (high-density plasma) method. As a result, the space in the central portion of the aforementioned opening of the pixel forming region 4 and the space in the central portion of the inside of the trench 34 of the peripheral circuit forming region 20 are filled with the silicon oxide film 37.

Figure 6I:
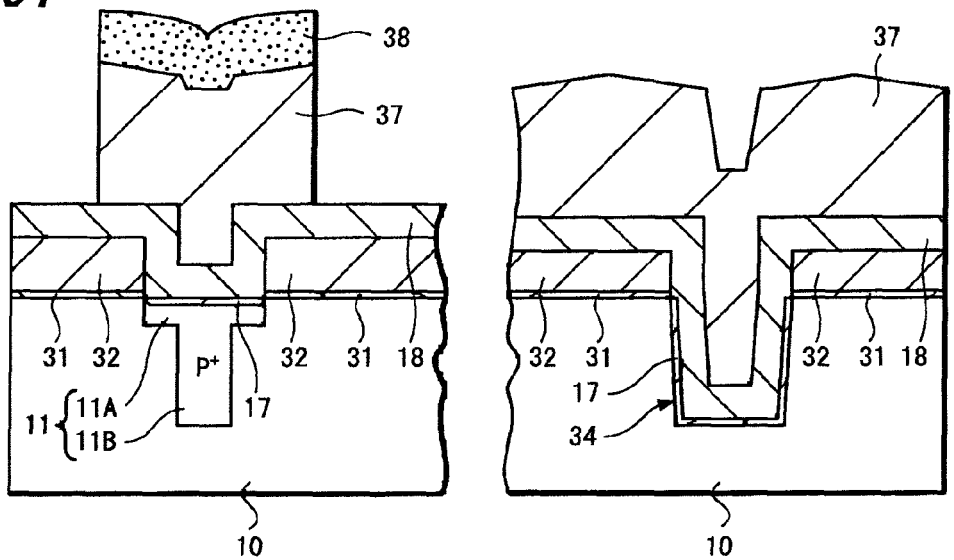

Next, as shown in FIG. 6I, a resist mask 38 is used and the silicon oxide film 37 is selectively etched away at its relatively thick portion on the element forming region. This process is used to match the polishing speeds with each other in the CMP process on the plane of the wafer.

Figure 6J:
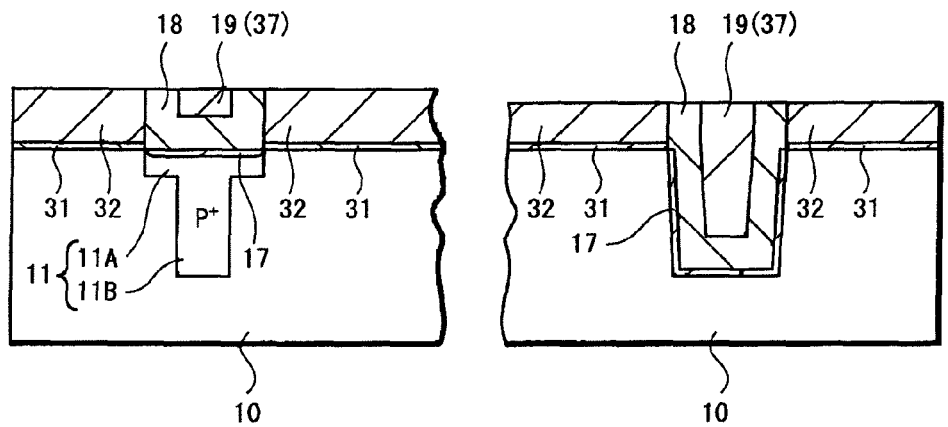

Subsequently, when the surface is planarized by using a CMP (chemical mechanical polish) method and an etch-back method, the silicon oxide film 37 is removed from the silicon nitride film 32. At that time, the silicon nitride film 32 acts as a stopper layer for use in the CMP process or the etching process. As a result, only the silicon oxide film 37 within the opening of the silicon nitride film 32 is left in the pixel forming region 4 and the peripheral circuit forming region 20 and it serves as the silicon oxide film 19 shown in FIG. 3 (see FIG. 6J).

Next, the silicon nitride film 32 is removed by using hot phosphoric acid solution.

Figure 6K:
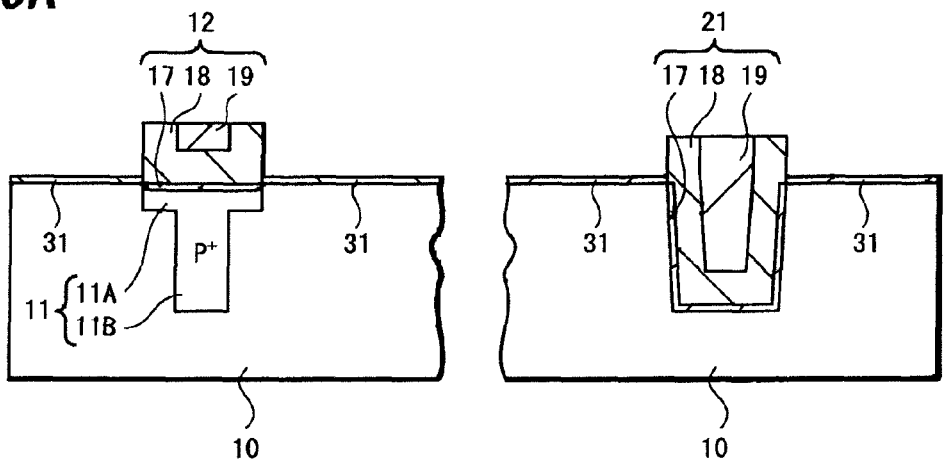

As a result, as shown in FIG. 6K, in the pixel forming region 4, the element isolation layer (cover layer) 12 is formed on the semiconductor substrate 10 by the convex-like insulating layer (silicon oxide film 17, silicon oxide film 18 and silicon oxide film 19) and the element isolation region (channel stopper diffusion layer) 11 is formed under the element isolation layer (cover layer) 12.

On the other hand, the element isolation layer 21 formed of the insulating layers (silicon oxide film 17, silicon oxide film 18 and silicon oxide film 19) is formed on the peripheral circuit forming region 20 of the same silicon substrate 10 as the STI structure.

Figure 6L:
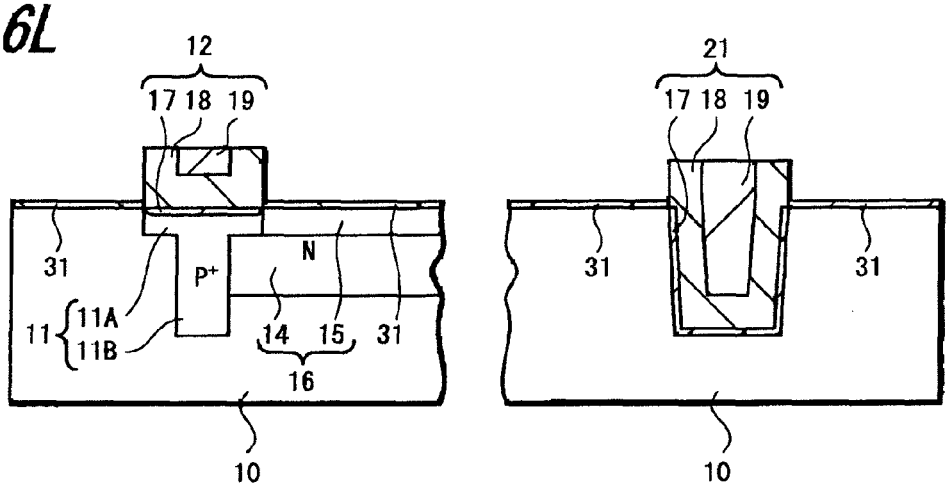

Thereafter, as shown in FIG. 6L, the N type electrical charge accumulation region 14 of the sensor portion 16, the positive electrical charge accumulation region 15 and the source/drain regions of the transistor and the like are sequentially formed by implanting ions on the semiconductor substrate 10.

Then, after the gate electrode and the like were formed on the silicon oxide film 31 formed on the surface of the semiconductor substrate 10, if necessary, a color filter and an on-chip micro lens and the like are formed on the pixel forming region 4, thereby resulting in the solid-state image pickup device being manufactured.

According to the above-mentioned manufacturing method, by adding necessary and minimum processes to the related-art STI forming process, the element isolation layer 21 can be formed on the peripheral circuit forming region 20 as the STI structure and the element isolation layer (cover layer) 12 and the element isolation region 11 for junction and isolation can be formed on the pixel forming region 4.

In the cross-sectional view of FIG. 3 and in the above-mentioned manufacturing method, the element isolation layer (cover layer) 12 of the pixel forming region 4 and the element isolation layer 21 of the peripheral circuit forming region 20 are formed so as to have substantially the same width.

On the other hand, as mentioned before, when the minimum isolation width of the element isolation portion of the peripheral circuit forming region 20 is smaller than that of the element isolation portion of the pixel forming region 4, in the process shown in FIG. 6B, the width of the opening formed on the silicon nitride film 32 may be decreased in the peripheral circuit forming region 20.

Also, in the cross-sectional view of FIG. 3 and the above-mentioned manufacturing method, the height H1 of the element isolation layer (cover layer) 12 of the pixel forming region 4 and the height H2 of the element isolation layer 21 of the peripheral circuit forming region 20 are slightly different from each other.

On the other hand, if the silicon nitride film 32 can be substantially prevented from being etched away in the process for forming the groove 34 in the silicon substrate 10, for example, then it becomes possible to make these element isolation layers 12 and 21 become substantially the same in height.

According to the above-mentioned solid-state image pickup device of this embodiment, since the element isolation layer (cover layer) 12 constructing the element isolation portion of the pixel forming region 4 and the element isolation layer 21 constructing the element isolation portion of the peripheral circuit forming region 20 are composed of the same insulating layers 17, 18 and 19, the process for forming the element isolation layer (cover layer) 12 of the pixel forming region 4 and the process for forming the element isolation layer 21 of the peripheral circuit forming region 20 can be made common.

Thus, it is possible to decrease the number of manufacturing processes.

Also, since the N type electrical charge accumulation region 14 of the sensor portion 16 is formed so as to be extended under the element isolation layer (cover layer) 12, the sensor portion 16, that is, the photoelectric-converting element is extended under the element isolation layer (cover layer) 12 so that a saturation electrical charge amount can be obtained at the maximum.

Thus, it becomes possible to improve characteristics, such as resolution, of the solid-state image pickup device.

Also, in the pixel forming region 4, the element isolation region 11 within the semiconductor substrate 10 and the element isolation layer (cover layer) 12 constitute the element isolation portion.

Thus, as compared with the case in which the element isolation portion having the STI structure is constructed, it is possible to decrease the noises caused by the crystal defect near the element isolation portion, the damage and the interface state density.

Further, since the element isolation layer 21 having the STI structure is formed in the peripheral circuit forming region 20 similarly to the element isolation portion of the related-art CMOS sensor, the operation speed of the peripheral circuit can be increased, the power consumption can be decreased and the space can be saved at the same time.

While the element isolation layer (cover layer) 12 of the pixel forming region 4 and the element isolation layer 21 of the peripheral circuit forming region 20 are formed of the same insulating layers 17, 18 and 19 in the above-mentioned embodiment, the present invention is not limited to the above-mentioned arrangement in which these element isolation layers 12 and 21 are formed of the same insulating layers 17, 18 and 19.

More specifically, according to the present invention, the element isolation layer of the pixel forming region and the element isolation layer of the peripheral circuit forming region may contain at least the same insulating layers, the same insulating layers may be made common and these element isolation layers may contain the insulating layers which are partly different. Also in this case, since the manufacturing process of the element isolation layer of the pixel forming region and the manufacturing process of the element isolation layer of the peripheral circuit forming region can be carried out at the same time at least a part of the process (the same insulating layer forming process) is carried out, it is possible to decrease the number of the manufacturing processes.

While the semiconductor substrate 10 such as the silicon substrate was used as the semiconductor substrate in the above-mentioned embodiment, the present invention is not limited thereto and a semiconductor substrate may be composed of a semiconductor substrate and a semiconductor epitaxial layer formed on the semiconductor substrate, for example.

According to above-mentioned present invention, in the pixel forming region, the noises caused by the crystal defect of the element isolation region portion, the damage and the interface state density can be decreased. Also, it is possible to improve characteristics, such as resolution, of the solid-state image pickup device.

Further, in the peripheral circuit forming region, the peripheral circuit can be increased in speed, it can be decreased in power consumption and it can be saved in space at the same time. Also, it becomes possible to microminiaturize the solid-state image pickup device.

Further, according to the present invention, in the manufacturing process of the element isolation layer of the pixel forming region and the manufacturing process of the element isolation layer of the peripheral circuit forming region, since processes of at least one portion can be carried out at the same time, it is possible to decrease the number of the manufacturing processes of the solid-state image pickup device.

Accordingly, since the number of the manufacturing processes can be decreased, it is possible to achieve effects such as shortening of a time required to manufacture the solid-state image pickup device.

According to the above-mentioned arrangement of the solid-state image pickup device of the present invention, since the second element isolation portion composed of the element isolation region formed within the semiconductor substrate and the element isolation layer protruded in the upper direction from the semiconductor substrate is formed in the pixel forming region, the junction and isolation can be carried out by the element isolation region (impurity region) formed within the semiconductor substrate. Then, since the insulating layer is not deeply buried into the semiconductor substrate in the second element isolation portion, it is possible to suppress the crystal defect, the damage and the interface state density from being generated in the semiconductor substrate around the element isolation portion. Hence, noises caused by the crystal defect, the damage and the interface state density can be decreased.

Also, in the peripheral circuit forming region, since the first element isolation portion is formed of the element isolation layer (STI structure) formed by burying the insulating layer into the semiconductor substrate, the operation speed of the peripheral circuit can be increased, the power consumption can be decreased and the space thereof can be saved at the same time.

Further, since the element isolation layer of the first element isolation portion and the element isolation layer of the second element isolation portion are formed so as to include the same insulating layers, in the manufacturing process of the element isolation layer of the first element isolating portion and the manufacturing process of the element isolation layer of the second element isolation portion, processes of at least one portion (processes for forming the same insulating layers) can be carried out at the same time.

According to above-mentioned solid-state image pickup device manufacturing method of the present invention, the stopper layer is formed on the semiconductor substrate and the insulating layers are buried into the insides of the groove and the opening formed from the stopper layer and planarized, whereby the insulating layers higher than the insulating layers are removed by planarization and the insulating layers are left only in the inside of the groove and the inside of the opening.

Then, in the portion serving as the peripheral circuit forming region, since the groove reaching the inside of the semiconductor substrate from the stopper layer and the insulating layer is buried into the inside of the groove, the STI structure in which the insulating layer is buried into the semiconductor substrate can be formed and the element isolation portion composed of the element isolation layer having the STI structure can be formed.

Also, in the portion serving as the pixel forming region, since the opening portion shallower than the groove is formed from the stopper layer and the insulating layer is buried into the inside of the opening portion, the element isolation layer of which depth within the semiconductor substrate is shallow and which is formed of the insulating layer protruded from the semiconductor substrate can be formed. Since the depth within the semiconductor substrate is shallow, it becomes possible to suppress the occurrence of the aforementioned noises.

Further, by the process in which the insulating layers are buried into the inside of the groove and the inside of the opening portion of the pixel forming region and in which they are planarized, the insulating layers are buried into the inside of the groove of the peripheral circuit forming region and the inside of the opening portion of the pixel forming region, whereby the insulating layers constructing the element isolation layer of the peripheral circuit forming region and the insulating layers constructing the element isolation layer of the pixel forming region can be formed at the same time.

That is, in the manufacturing process of the element isolation layer of the peripheral circuit forming region and the manufacturing process of the element isolation layer of the pixel forming region, processes of at least one portion (processes for forming the above-described insulating layers) can be carried out at the same time.

In the above-described solid-state image pickup device according to the present invention, the photoelectric-converting element can be extended under the element isolation layer of the second element isolation portion.

According to the above-mentioned arrangement, the saturation electrical charge amount can be obtained at the maximum. As a result, it becomes possible to improve characteristics, such as resolution, of the solid-state image pickup device.

In the above-described solid-state image pickup device according to the present invention, it is preferable that the depth of the first element isolation portion within the semiconductor substrate should fall within a range of from 150 nm to 450 nm, the depth of the element isolation layer of the second element isolation portion within the semiconductor substrate should be less than 50 nm and that the thickness thereof should fall within a range of from 50 nm to 150 nm.

According to the above-described arrangement, since the depth of the element isolation layer of the second element isolation portion within the semiconductor substrate is less than 50 nm, the occurrence of noise can be decreased sufficiently. Also, since the thickness thereof is selected in a range of from 50 nm to 150 nm, the leakage electric current of the parasitic MOS transistor can be suppressed and processing of the gate electrode formed on the element isolation layer can become easy.

In the above-described solid-state image pickup device according to the present invention, it is preferable that the minimum isolation width of the first element isolation portion should be smaller than that of the second element isolation portion.

According to the above-mentioned arrangement, by the first element isolation portion with the small minimum isolation width, the peripheral circuit forming region can be microminiaturized more, operation speed of the solid-state image pickup device can be increased, power consumption thereof can be decreased and the space thereof can be saved. Also, by the second element isolation portion with the large minimum isolation width, in the pixel forming region, the occurrence of the noise and the leakage electric current can be suppressed sufficiently.

According to above-mentioned present invention, in the pixel forming region, the noises caused by the crystal defect of the element isolation region portion, the damage and the interface state density can be decreased. Also, it is possible to improve characteristics, such as resolution, of the solid-state image pickup device.

Further, in the peripheral circuit forming region, the peripheral circuit can be increased in speed, it can be decreased in power consumption and it can be saved in space at the same time. Also, it becomes possible to microminiaturize the solid-state image pickup device.

Further, according to the present invention, in the manufacturing process of the element isolation layer of the pixel forming region and the manufacturing process of the element isolation layer of the peripheral circuit forming region, since the processes of at least one portion can be carried out at the same time, it is possible to decrease the number of the manufacturing processes of the solid-state image pickup device.

Accordingly, since the number of the manufacturing processes can be decreased, it is possible to achieve effects such as shortening of a time required for manufacturing the solid-state image pickup device.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state image pickup device in which a pixel forming region composed of a pixel formed of a photoelectric-converting element and a selection transistor for reading signal electrical charges from said photoelectric-converting element and a peripheral circuit forming region are formed on the same semiconductor substrate, comprising the steps of:

a process for forming a stopper layer on said semiconductor substrate;

a process for forming an opening portion by selectively removing said stopper layer of the portion corresponding to an element isolation portion in the portion serving as said pixel forming region and the portion serving as said peripheral circuit forming region;

a process for forming a trench ranging from said stopper layer to the inside of said semiconductor substrate in the portion serving as said peripheral circuit forming region; and a process for planarizing said trench and said opening portion by burying insulating layers into the inside of said trench and into the inside of said opening portion of said pixel forming region.

* * * * *